United States Patent
Gardner

(10) Patent No.: US 7,518,218 B2
(45) Date of Patent: Apr. 14, 2009

(54) TOTAL IONIZING DOSE SUPPRESSION TRANSISTOR ARCHITECTURE

(75) Inventor: Harry N. Gardner, Colorado Springs, CO (US)

(73) Assignee: Aeroflex Colorado Springs, Inc., Colorado Springs, CO (US)

( * ) Notice: Subject to any disclaimer, the term of this patent is extended or adjusted under 35 U.S.C. 154(b) by 185 days.

(21) Appl. No.: 11/071,730

(22) Filed: Mar. 3, 2005

(65) Prior Publication Data

US 2006/0197108 A1 Sep. 7, 2006

(51) Int. Cl.
*H01L 23/552* (2006.01)
(52) U.S. Cl. .................. 257/659; 257/508; 257/921; 257/E23.114
(58) Field of Classification Search ........... 257/508, 257/660, 921; 438/953
See application file for complete search history.

(56) References Cited

U.S. PATENT DOCUMENTS

| | | | |
|---|---|---|---|
| 6,091,630 A | 7/2000 | Chan et al. | |
| 6,194,276 B1 | 2/2001 | Chan et al. | |
| 6,225,178 B1 | 5/2001 | Shaw et al. | |
| 6,225,667 B1 | 5/2001 | Buynoski et al. | |
| 6,380,598 B1 | 4/2002 | Chan | |
| 6,417,030 B1 | 7/2002 | Buynoski et al. | |
| 6,455,884 B1 | 9/2002 | Chan et al. | |
| 6,511,893 B1 | 1/2003 | Woodruff et al. | |
| 6,531,739 B2 | 3/2003 | Cable et al. | |
| 6,570,234 B1 | 5/2003 | Gardner | |
| 6,656,803 B2 | 12/2003 | Chan | |
| 6,730,969 B1* | 5/2004 | Padmanabhan et al. | 257/356 |
| 6,744,661 B1 | 6/2004 | Shubat | |
| 6,777,753 B1 | 8/2004 | Summers et al. | |
| 2002/0086461 A1 | 7/2002 | Chan | |
| 2002/0171104 A1 | 11/2002 | Cable et al. | |
| 2003/0022527 A1 | 1/2003 | Devine et al. | |
| 2003/0036236 A1 | 2/2003 | Benedetto et al. | |
| 2003/0058027 A1* | 3/2003 | Kwon et al. | 327/401 |
| 2003/0143811 A1 | 7/2003 | Benedetto et al. | |
| 2003/0173591 A1 | 9/2003 | Cable et al. | |
| 2004/0166648 A1 | 8/2004 | Woodruff et al. | |
| 2005/0056889 A1* | 3/2005 | Ma et al. | 257/335 |

* cited by examiner

*Primary Examiner*—Andy Huynh
*Assistant Examiner*—Hoang-Quan T Ho
(74) *Attorney, Agent, or Firm*—Peter J. Meza; William J. Kubida; Hogan & Hartson LLP

(57) ABSTRACT

A total ionizing dose suppression architecture for a transistor and a transistor circuit uses an "end cap" metal structure that is connected to the lowest potential voltage to overcome the tendency of negative charge buildup during exposure to ionizing radiation. The suppression architecture uses the field established by coupling the metal structure to the lowest potential voltage to steer the charge away from the critical field (inter-device) and keeps non-local charge from migrating to the "birds-beak" region of the transistor, preventing further charge buildup. The "end cap" structure seals off the "birds-beak" region and isolates the critical area. The critical area charge is source starved of an outside charge. Outside charge migrating close to the induced field is repelled away from the critical region. The architecture is further extended to suppress leakage current between adjacent wells biased to differential potentials.

8 Claims, 9 Drawing Sheets

TOTAL IONIZING DOSE SUPPRESSION TRANSISTOR ARCHITECTURE

FIELD OF THE INVENTION

The present invention relates to a radiation-hardened transistor architecture and integrated circuit device.

BACKGROUND OF THE INVENTION

Electrons trapped in high earth orbits and electrons and protons trapped in low and medium earth orbits cause a high level of ionizing radiation in space. Such ionizing radiation causes an accumulation of charge in electronic circuits which eventually results in a malfunction or failure of the circuits.

Electron-hole pairs generated in the bulk silicon of an integrated circuit do not present a severe problem, as the electrons and holes recombine rapidly. Electron-hole pairs formed near the field oxide of an integrated circuit are more difficult to deal with because the electrons are far more mobile than the holes and may become separated from the holes and trapped near the field oxide interface. This interferes with recombination and results in an accumulation of net positive charge in the field oxide, or other dielectric film. The edge region between the diffusion region and the field oxide below a polysilicon gate, referred to as the "bird's beak" region, is particularly susceptible to the effect of the ionizing radiation. The accumulation of net positive charge in the field oxide beneath the polysilicon gate can cause leakage of electrons across the gate, turning on the gate prematurely. Even slight leakage across the many gates in a typical integrated circuit can cause excess power drain and overheating of the integrated circuit.

Integrated circuit designs have been developed to withstand high levels of ionizing radiation. Such design methodologies can involve redundancy of electronic circuits, suitable doping of the semiconductor material and spacing of electronic circuits. Such methodologies require increased cost for redesign and production.

Typical NMOS transistors 100 and 102 are shown in FIG. 1. Transistor 100 includes source/drain regions 104 and 108, and polysilicon gate 106. Transistor 102 includes source/drain regions 112 and 114, and polysilicon gate 116. If one of the source/drain contacts of transistor 100 is coupled to ground as shown, and the adjacent source/drain contact of transistor 102 is coupled to VCC as shown, then inter-device leakage 110 can occur between the two transistors due to the presence of ionizing radiation. In addition, intra-device leakage 118 can also occur between source/drains 112 and 114, if one of the source/drain contacts is coupled to ground, and the other is coupled to VCC, as shown.

An N-channel transistor circuit 200 is shown in FIG. 2A. Transistor circuit 200 includes two N-channel transistors coupled together, suitable for use in either a NAND or NOR gate. Transistor circuit 200 includes a first transistor M1 having a source/drain 202, and a gate 204. Transistor circuit 200 also includes a second transistor M2 having a source/drain 214, and a gate 210. The other source/drains of transistors M1 and M2 are coupled together at node 208. Body contacts 206 and 212 can be coupled to ground. In a NAND gate 220, source/drain 202 is coupled to two P-channel transistors as shown in FIG. 2B and source/drain 214 is coupled to ground. In a NOR gate 230, source/drains 202 and 214 are coupled to ground, and node 208 is coupled to two P-channel transistors as shown in FIG. 2C.

The N-channel transistor circuit 200 is susceptible to intra-device and inter-device leakage currents due to ionizing radiation, just as is a single N-channel transistor.

One prior art technique for forming a radiation-hardened transistor circuit 200 is shown in FIG. 3. Two annular transistor circuits are shown, each containing two N-channel transistors as is taught in U.S. Pat. No. 6,570,234 to Gardner, which is hereby incorporated by this reference. A first transistor circuit device 300 includes source/drains regions 308, 306, and 304 corresponding to source/drain regions S/D 1, S/D 2, and S/D 3 shown in FIG. 2. Transistor circuit 300 also includes first and second annular gates 302 and 310, as well as a thick field oxide region 312. A second transistor circuit device 314 includes source/drains regions 324, 322, and 320 corresponding to source/drain regions S/D 1, S/D 2, and S/D 3 shown in FIG. 2. Transistor circuit 314 also includes first and second annular gates 318 and 326, as well as a thick field oxide region 328.

Transistor circuits 300 and 314 effectively reduce leakage current due to ionizing radiation. Inter-device leakage current in region 316 is effectively reduced if source/drain regions 304 and 320 are coupled to ground. Additionally, intra-device leakage current along edge 330 is effectively reduced since both halves of the annular gate "A" 318 are at the same potential.

While transistor circuits 300 and 314 (and other known annular transistor and transistor circuit designs known in the art) effectively reduce leakage currents induced by ionizing radiation, they do so at the expense of precious integrated circuit area. Annular gates have four sides, and therefore take up much more area than a standard gate such as the gates of the prior art transistors shown in FIG. 1.

What is desired, therefore, is a transistor architecture and transistor circuit device architecture that has the desirable radiation-hardened characteristics of annular designs, but does so in a much smaller area.

SUMMARY OF THE INVENTION

In accordance with an aspect of this invention, a total ionizing dose suppression architecture for a transistor and a transistor circuit uses an "end cap" metal structure that is connected to ground potential voltage to overcome the tendency of negative charge buildup during exposure to ionizing radiation. The suppression architecture of the present invention uses the field established by coupling the metal structure to ground to steer the charge away from the critical field (inter-device) and keeps non-local charge from migrating to the "birds-beak" region of the transistor, preventing further charge buildup. The "end cap" structure seals off the "birds-beak" region and isolates the critical area. The critical area charge is source starved of an outside charge. Outside charge migrating close to the induced field is repelled away from the critical region.

In a first embodiment, an N-channel radiation-hardened transistor includes an active region surrounded by thick oxide, a polysilicon or metal gate crossing the active region, defining first and second source/drain regions, and a metal region coupled to the lowest supply potential overlapping the boundary of the active region, and completely surrounding each of the ends of the gate that extends beyond the border of the active region. The metal region overlapping the boundary of the active region can be made to completely surround the first end of the gate extending beyond the border of the active region, and completely cover the second end of the gate extending beyond the border of the active region.

In a second embodiment, a radiation-hardened device includes an active region surrounded by thick oxide, first and second polysilicon or metal gates crossing the active region, defining first, second, and third source/drain regions, and a metal region coupled to ground overlapping the boundary of the active region, and completely surrounding each of the ends of the first and second gates that extend beyond the border of the active region, wherein the first source/drain region defines the source/drain region of a first N-channel transistor, the third source/drain region defines the source/drain region of a second N-channel transistor, and the second source/drain region defines a common source/drain region for the first and second N-channel transistors.

In the radiation-hardened device of the second embodiment, either the first or third source/drain regions are coupled to the lowest potential, so that the device is suitable for use in a NAND gate. Alternatively, in the radiation-hardened device of the second embodiment, the first and third source/drain regions are coupled to ground, so that the device is suitable for use in a NOR gate.

In another embodiment, the radiation-hardened device of the present invention can be expanded to include any number N transistors with (N+1) source/drain regions.

The metal region overlapping the boundary of the active region, can be made to completely surround the first end of the first and second gates that extend beyond the border of the active region, and to completely cover the second end of the first and second gates that extend beyond the border of the active region.

In a multiple-well embodiment one or more N-wells or N+ regions can become the effective source/drain while a region of lower supply potential becomes another source/drain. Metal isolation surrounding these areas and tied to the lowest voltage potential is used to isolate leakage between the two wells and/or regions.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION OF THE INVENTION

Figure 4:
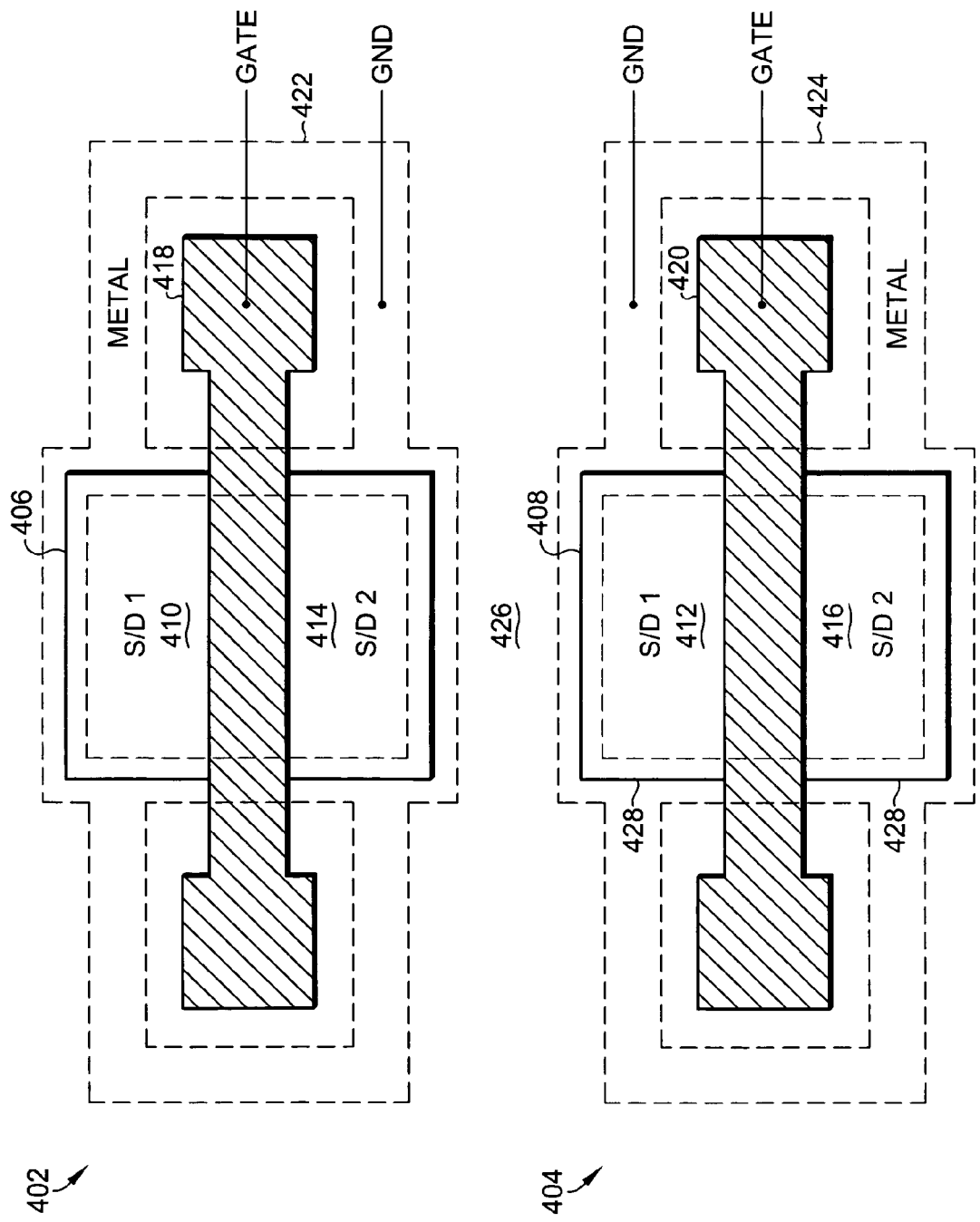
FIG. 4 is a plan view of two radiation-hardened N-channel transistors according to the present invention.

Referring now to FIG. 4, a plan view of two radiation-hardened N-channel transistors 402 and 404 is shown according to an embodiment of the present invention. A first N-channel radiation-hardened transistor 402 includes an active region 406 surrounded by thick oxide, a polysilicon or metal gate 418 crossing the active region 406, defining first and second source/drain regions 410 and 414. A metal region 422 is coupled to ground and overlaps the boundary of the active region 406, and completely surrounds each of the ends of the gate 418 that extends beyond the border of the active region 406. A second N-channel radiation-hardened transistor 404 includes an active region 408 surrounded by thick oxide, a polysilicon or metal gate 420 crossing the active region 408, defining first and second source/drain regions 412 and 416. A metal region 424 is coupled to ground and overlaps the boundary of the active region 408, and completely surrounds each of the ends of the gate 420 that extends beyond the border of the active region 406.

In operation, the charge accumulated from exposure to ionizing radiation is repelled by the field action of the metal regions 422 and 424. Hence, there is no inter-device induced leakage current in area 426. Additionally, the action of the field underneath the metal region 424 prevents intra-device leakage current along edge 428. Admittedly, some charge does develop in the immediate area surrounding the ends of the polysilicon or metal gates 418 and 420. However, this limited area is "source-starved" and only a minute amount of charge is developed. This tiny amount of charge is not sufficient to create significant leakage currents.

Figure 6A:
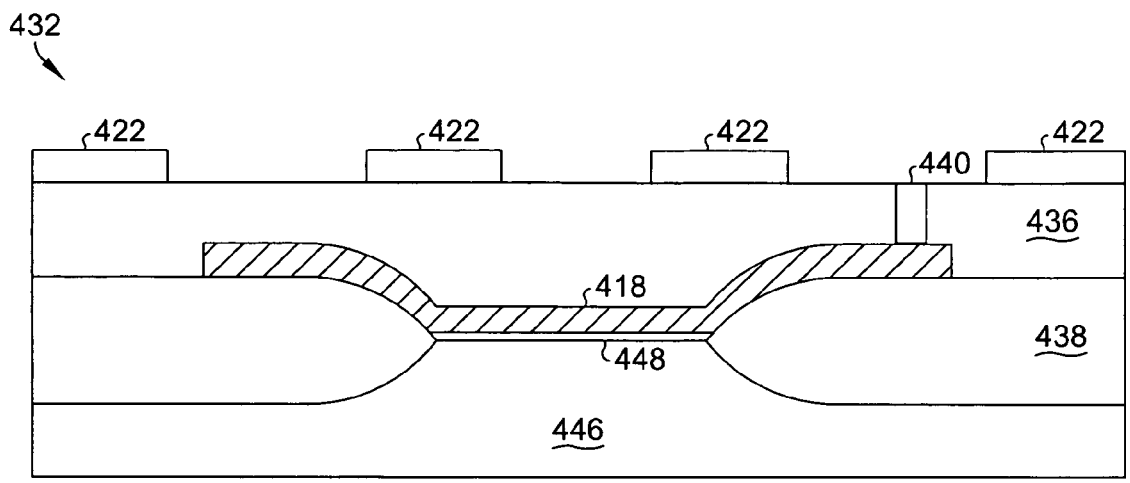
FIG. 6A is a cross-sectional view of one of the transistors shown in FIG. 4 taken along the axis of the polysilicon gate.

In transistors 402 and 404 it is important to note that the gate extends beyond the boundary of the active area 406 and 408 due to process requirements (typically no contacts are allowed over active gate areas). The gate extends beyond the boundary of the active area onto a thick field oxide area that completely surrounds the active area. Thus, either one or both of the ends of the gate may be contacted. The cross-sectional views of transistors 402 and 404 is shown in greater detail below with respect to FIGS. 6A and 6B.

Figure 5:
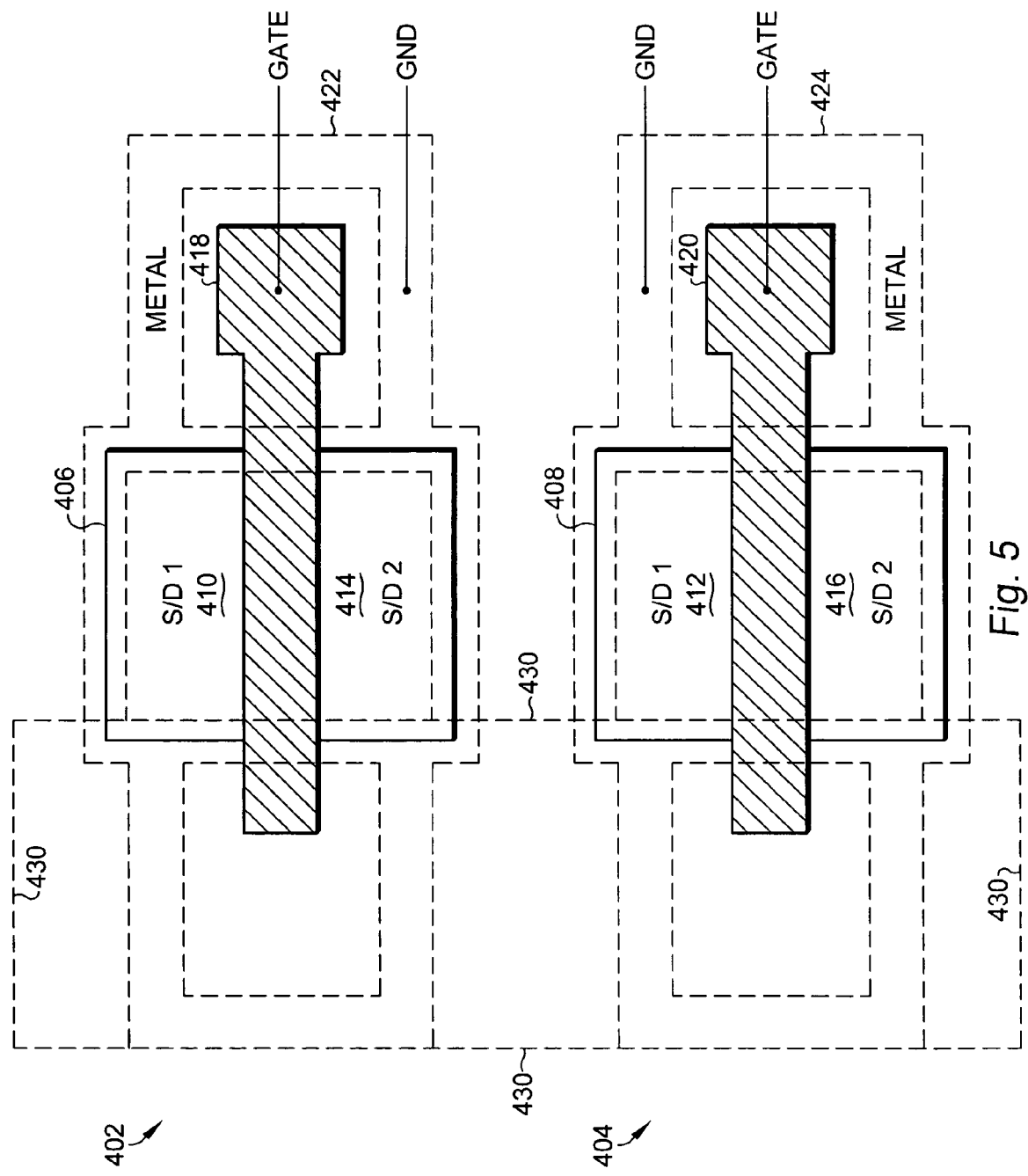
FIG. 5 is a plan view of two radiation-hardened N-channel transistors according to the present invention in which the metal region surrounding a first end of the gates of the first and second transistors has been extended to completely cover the first end of the gates.

Referring now to FIG. 5 a plan view of the two radiation-hardened N-channel transistors 402 and 404 is shown in which the metal region 430 surrounding a second end of the gates 418 and 420 has been extended to completely cover the first end of the gates. In the embodiment shown in FIG. 5, the second end of gates 418 and 420 are not contacted. Therefore, the gates can be completely covered over with metal area 430. Although metal area 430 is shown as a separate metal region in FIG. 5, it will be understood by those skilled in the art that metal area 430 can be merged with metal regions 422 and 424. If desired, therefore, the metal region 422, 424 overlapping the boundary of the active regions 406, 408 can be made to completely surround the first end of the gates 418, 420 extending beyond the border of the active regions 406, 408, and completely cover the second end of the gate extending beyond the border of the active region. In this way, even the tiny amount of induced field oxide charge can be substantially reduced for the gate end that is not contacted.

Figure 6B:
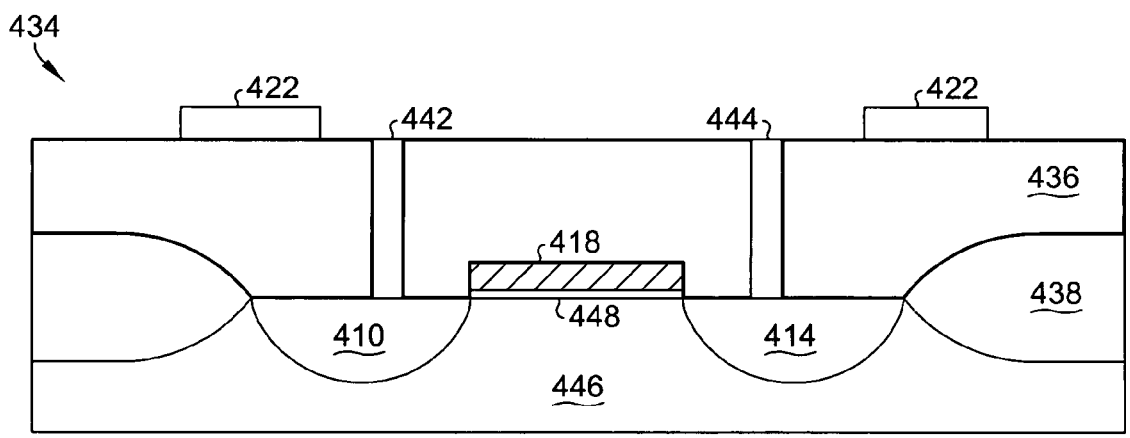
FIG. 6B is a cross-sectional view of one of the transistors shown in FIG. 4 taken across the axis of the polysilicon gate.
Figure 6C:
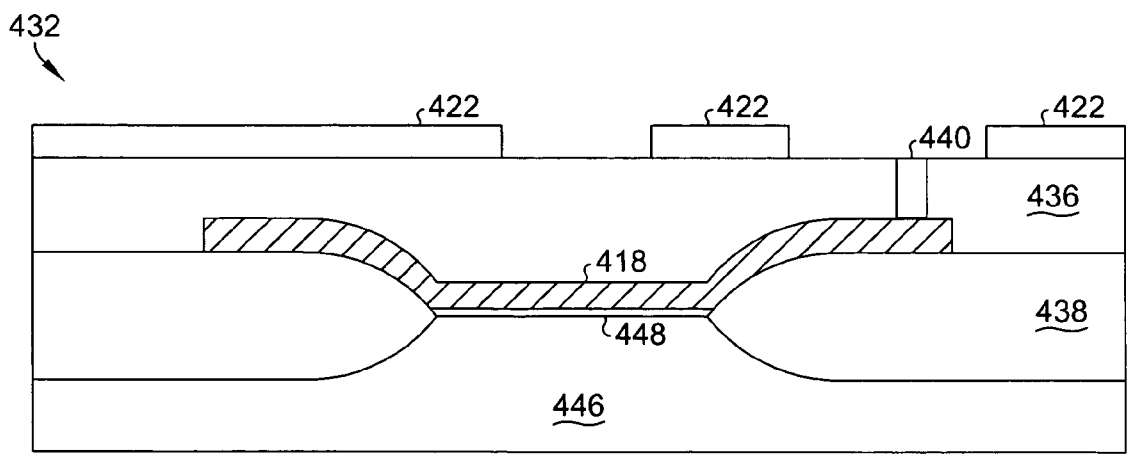
FIG. 6C is a cross-sectional view of one of the transistors shown in FIG. 5 taken along the axis of the polysilicon gate.

Referring now to FIG. 6C, a cross-sectional view 432 of one of the transistors shown in FIG. 5 is taken along the axis of the polysilicon gate. Thus, the semiconductor substrate or epitaxial layer 446 is shown. The gate oxide layer 448 is shown, within the boundary of the active area, surrounded by thick field oxide layer 438 on both sides. The polysilicon or metal gate 418 is shown, which is covered over by oxide layer 436. The isolating metal region 422 overlapping the active layer is shown, as well as a single contact 440 for providing electrical access to gate 418.

Referring now to FIG. 6B is a cross-sectional view 434 of one of the transistors shown in FIG. 4 or FIG. 5 taken across the axis of the polysilicon gate. Thus, the semiconductor substrate or epitaxial layer 446 is shown, including source/drain regions 410 and 414. The gate oxide layer 448 is shown, within the boundary of the active area, surrounded by thick field oxide layer 438 on both sides. The polysilicon or metal gate 418 is shown defining the source/drain regions 410 and 414, which is then all covered over by oxide layer 436. The isolating metal region 422 overlapping the active layer is shown, as well as two contacts 442 and 444 for providing electrical access to source/drain regions 410 and 414.

Figure 7:
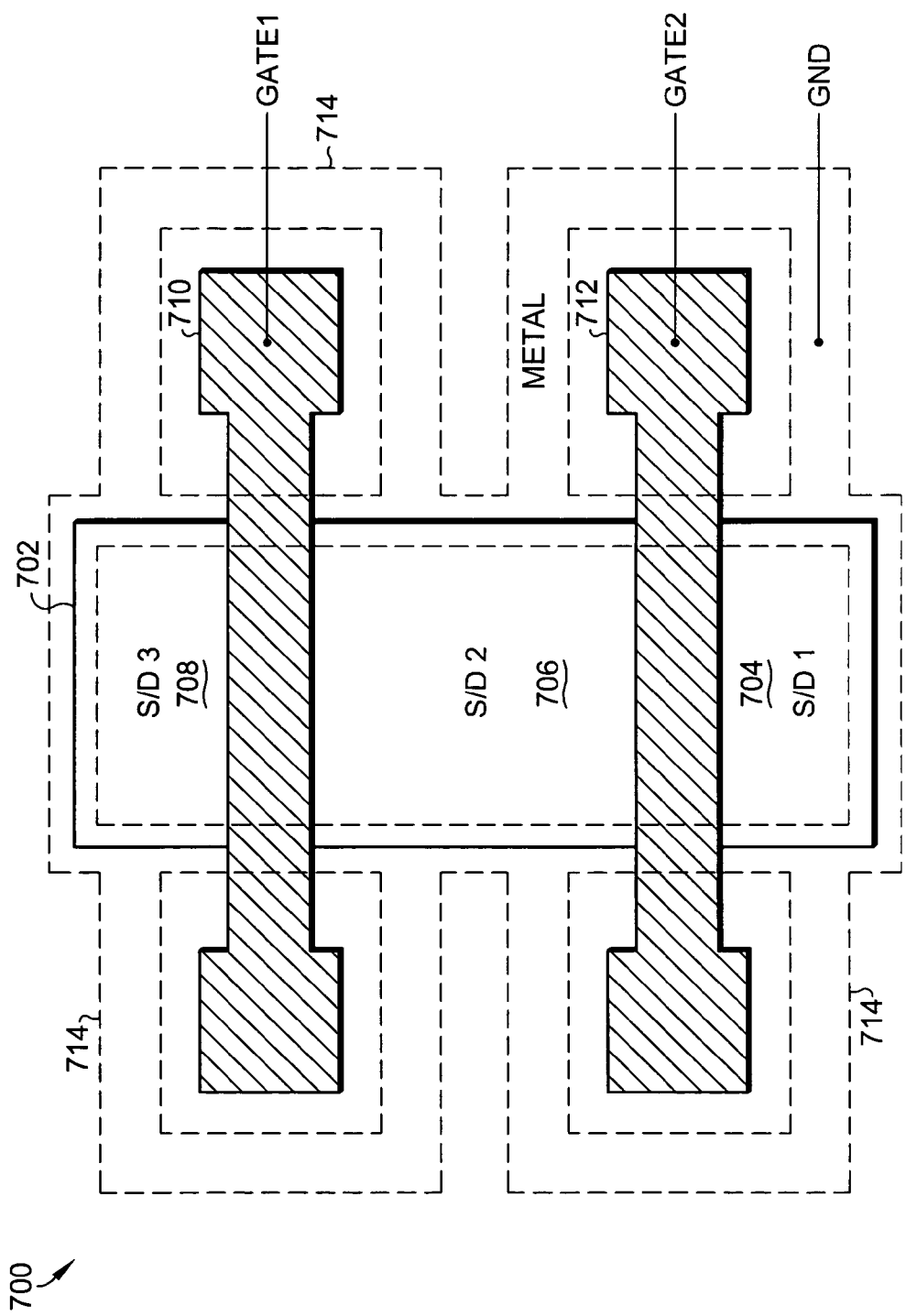
FIG. 7 is a plan view of an N-channel transistor circuit suitable for use in either a NAND gate or a NOR gate according to the present invention.

Referring now to FIG. 7 a plan view of an N-channel transistor circuit 700 suitable for use in either a NAND gate or a NOR gate according to a second embodiment of the present invention. Radiation-hardened device 700 includes an active region 702 surrounded by thick oxide, first and second polysilicon or metal gates 710 and 712 crossing the active region 702, defining first, second, and third source/drain regions 704, 706, and 708, and a metal region 714 coupled to ground overlapping the boundary of the active region 702, and completely surrounding each of the ends of the first and second gates 710 and 712 that extend beyond the border of the active region 702, wherein the first source/drain region 704 defines the source/drain region of a first N-channel transistor, the third source/drain region 708 defines the source/drain region of a second N-channel transistor, and the second source/drain region 706 defines a common source/drain region for the first and second N-channel transistors.

In the radiation-hardened device 700 of the second embodiment, either the first or third source/drain regions 704 and 708 are coupled to ground, so that the device is suitable for use in a NAND gate. Alternatively, in the radiation-hardened device 700 of the second embodiment, the first and third source/drain regions 704 and 708 are coupled to ground, so that the device is suitable for use in a NOR gate.

If desired, the metal region 714 overlapping the boundary of the active region 702, can be made to completely surround the first end of the first and second gates 710 and 712 that extend beyond the border of the active region, and to completely cover the second end of the first and second gates 710 and 712 that extend beyond the border of the active region, as was shown in FIG. 5.

While the radiation-hardened N-channel transistor and device of the present invention addresses the problem of impinging ionizing radiation, these transistors may oftentimes be integrated onto a circuit with other P-channel transistors fabricated inside of a lightly doped N-type well. If steps are not taken to account for these other transistors, there may be undesirable leakage current as is explained in further detail below. This problem is exacerbated in integrated circuits in which two or more well bias voltages are found.

Figure 8:
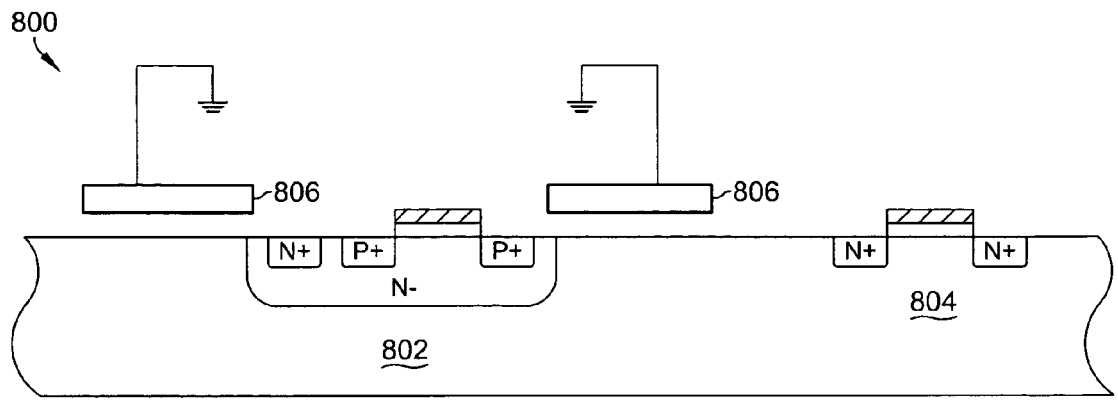
FIG. 8 is a cross-sectional view of an N-channel transistor and a P-channel transistor in a lightly doped well, as well as radiation-hardening metal regions according to the present invention.

Referring now to FIG. 8, a cross-sectional view 800 of an N-channel transistor 804 and a P-channel transistor in a lightly doped well 802. To prevent a leakage current flowing from the lightly doped N-type well to the N+ source/drain regions of the N-channel transistor, it would be desirable to add metal regions 806. Metal regions 806 are coupled to ground or to the lowest potential in the circuit to prevent leakage current due to ionizing radiation. However, in the example shown in FIG. 8, if N-channel transistor 804 is fabricated according to the present invention, then additional metal regions are not required, since the metal regions associated with transistor 804 itself will be sufficient to stop the leakage current.

Figure 9:
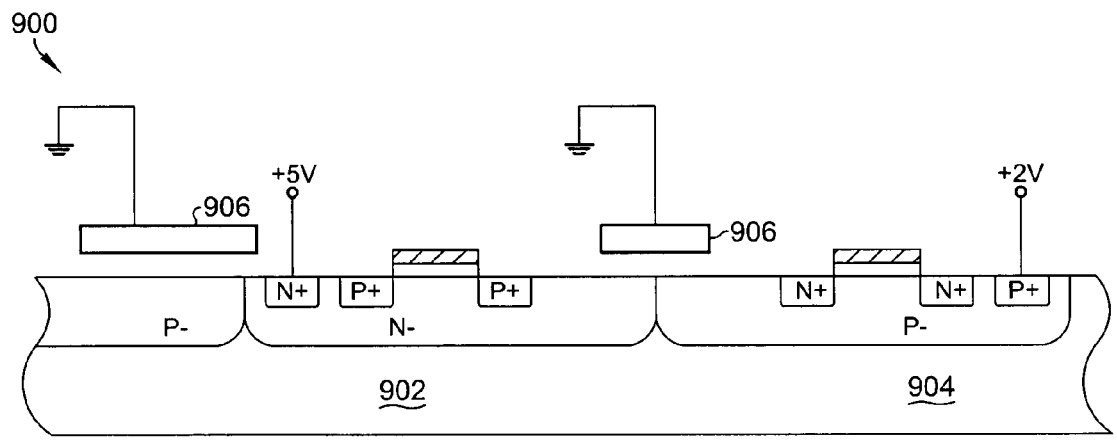
FIG. 9 is a cross-sectional view of an N-channel transistor and a P-channel transistor, both fabricated in lightly doped wells, as well as radiation-hardening metal regions according to the present invention.

Referring now to FIG. 9, a cross-sectional view 900 of an N-channel transistor 904 and a P-channel transistor 902, both fabricated in lightly doped wells, is shown. N-channel transistor 904 is formed in a lightly doped P-type well, and P-channel transistor 902 is formed in a lightly doped N-type well. In the example of FIG. 9, there may be leakage current between the wells, even if transistor 904 is fabricated according to the present invention. Therefore, additional protection is required to prevent leakage current between transistors formed in the lightly doped wells. This extra protection is provided by metal regions 906, which are coupled to ground or to the lowest potential in the circuit.

Figure 1:
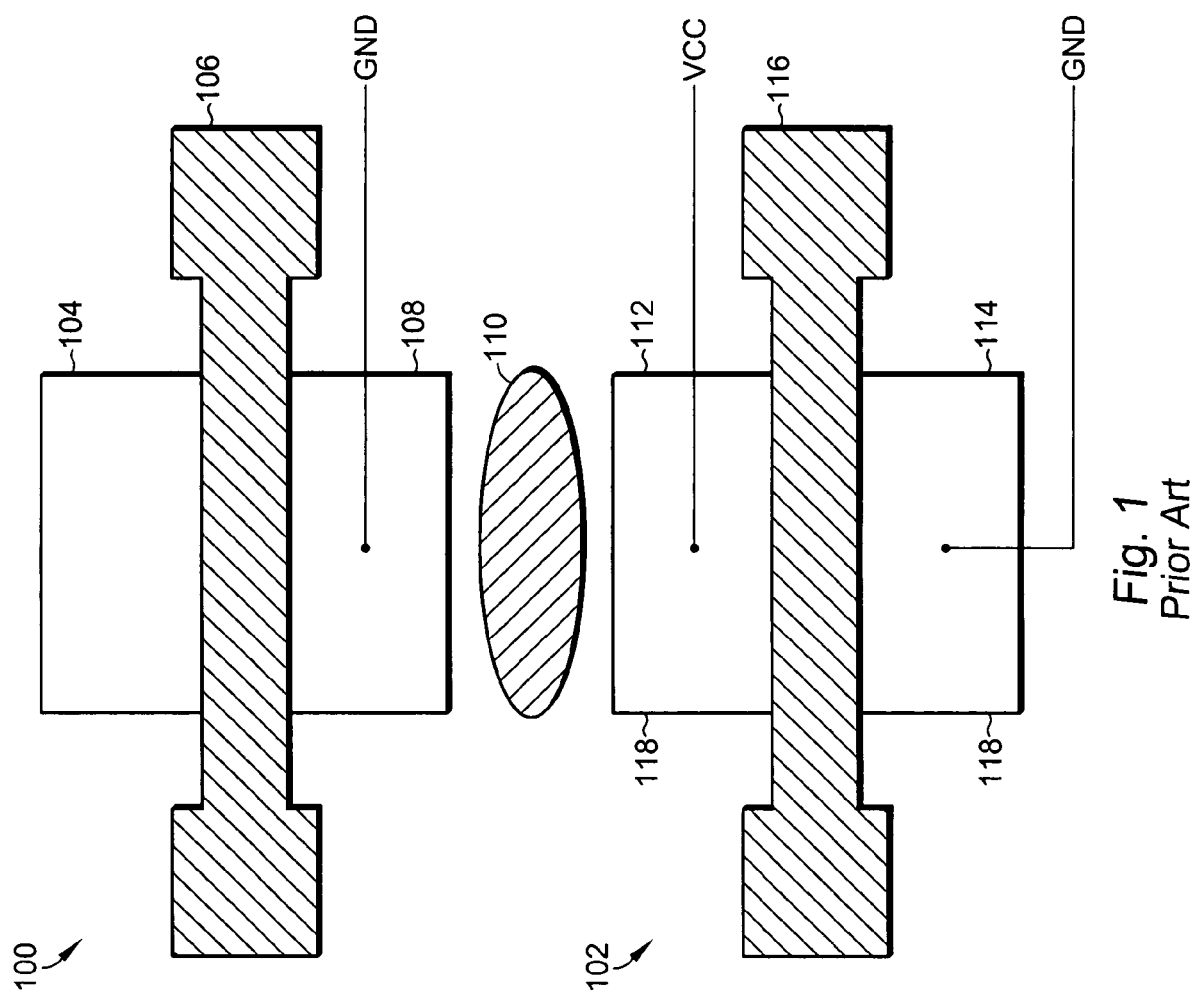
FIG. 1 is a plan view of two prior art N-channel transistors susceptible to inter-device and intra-device leakage currents induced by ionizing radiation.
Figures 2A, 2B, 2C:
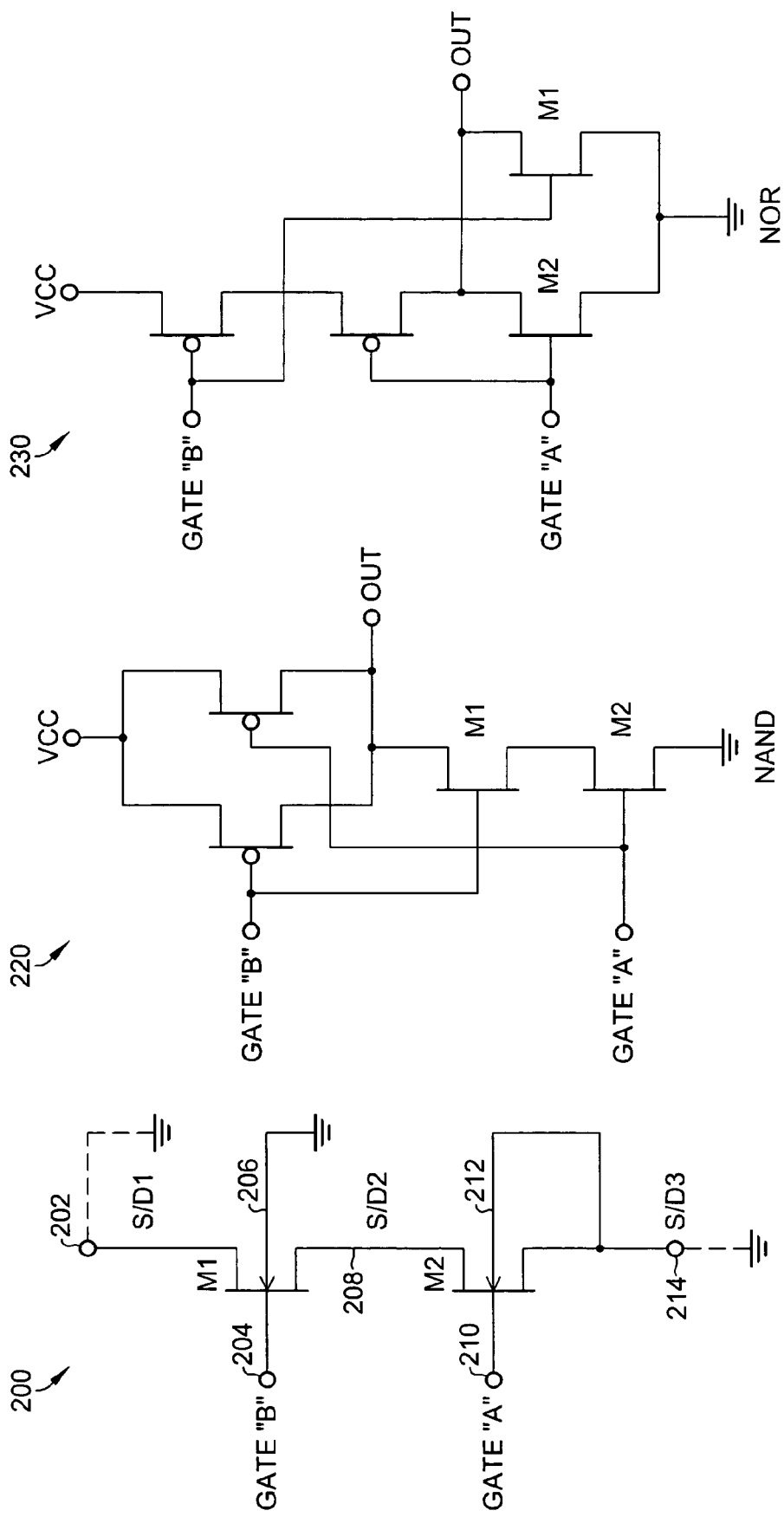
FIG. 2 is a schematic diagram of a prior art N-channel transistor circuit that is suitable for use in either a NAND gate or a NOR gate.
Figure 3:
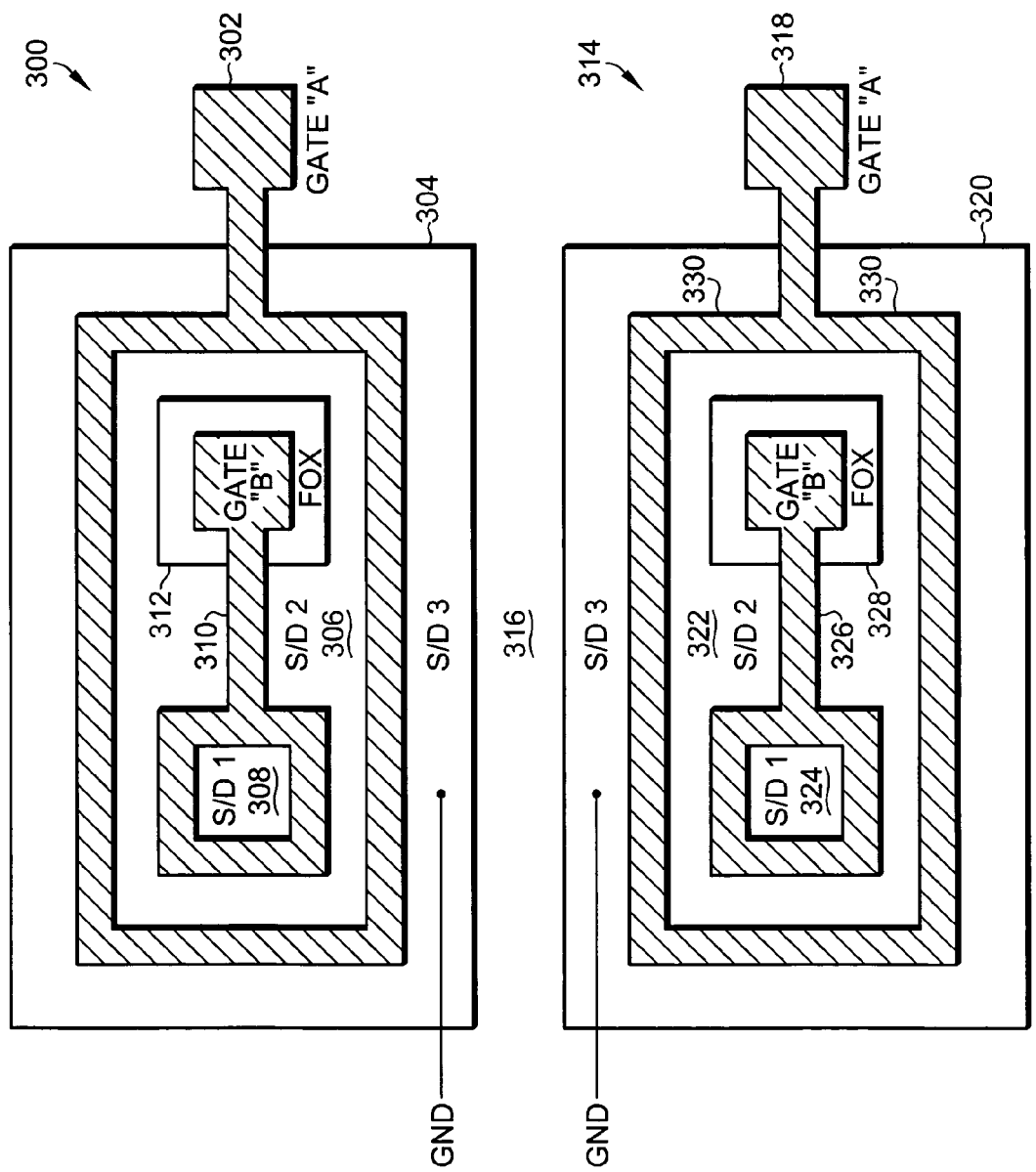
FIG. 3 is a plan view of two radiation-hardened transistor circuits of the type shown in FIG. 2 using an annular transistor structure.
Figure 10:
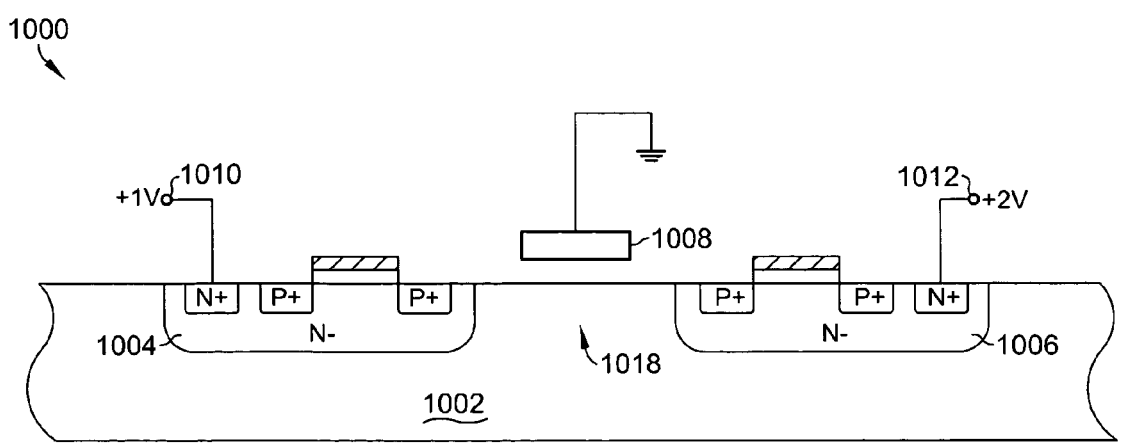
FIG. 10 is a cross-sectional view of two P-channel transistors, each in a lightly doped N-type well, including a metal region according to the present invention to suppress radiation-induced inter-device leakage current.

Referring now to FIG. 10, a cross-sectional view 1000 of two P-channel transistors 1004 and 1006 formed in lightly doped N-type wells is shown. The wells are formed in epitaxial layer or substrate 1002 as is known in the art. In modern semiconductor processes, it is possible that the wells of transistors 1004 and 1006 can be biased to different biasing voltages. For example, as is shown in FIG. 10, the N-type well of transistor 1004 is biased to one volt at node or pad 1010, while the N-type well of transistor 1006 is biased to two volts at node or pad 1012. To prevent radiation-induced leakage current between the wells in the area designated 1018, as well as possible leakage currents to other transistors and wells in the integrated circuit, a metal region 1008 is provided as shown. Metal region 1008 is coupled to ground or to the lowest voltage in the integrated circuit. It should be noted that the radiation-induced leakage current in area 1018 is similar in effect to the intra-device leakage current 118 as explained with respect to transistor 102 shown in FIG. 1.

Figure 11:
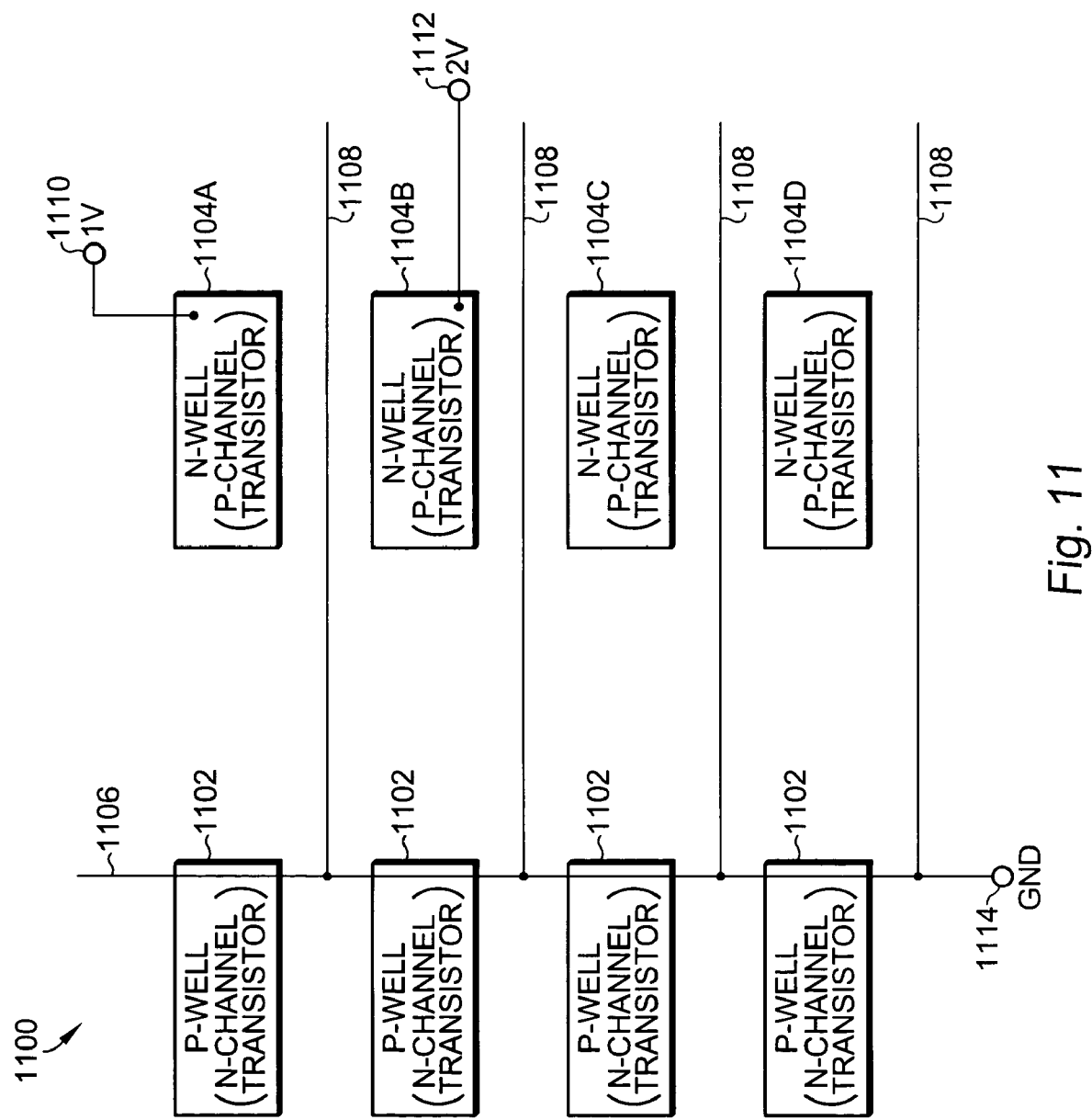
FIG. 11 is a simplified plan view of a metal layout for a small portion of an integrated circuit showing a plurality of N-channel transistors formed in P-type wells, including the device metal regions according to the present invention, as well as a plurality of P-channel transistors formed in N-type wells, in which the device metal regions of the N-channel transistors and the metal traces used to separate the P-channel transistors are joined together for receiving a ground voltage or lowest potential voltage for the purposes of providing optimum radiation hardening, according to the present invention.

Referring now to FIG. 11, a simplified plan view 1100 of a metal layout for a small portion of an integrated circuit is shown. A plurality of N-channel transistors 1102 formed in P-type wells include ringed metal areas 1106 (not shown in detail in FIG. 11, best shown in FIGS. 4 and 5) according to the present invention. A plurality of P-channel transistors 1104A, 1104B, 1104C and 1104D are formed in N-type wells, and are adjacent to the plurality of transistors 1102. Note that the well of transistor 1104A is biased to one volt at node 1110, and the well of transistor 1104B is biased to two volts at node 1112. The ringed metal regions 1106 of the N-channel transistors 1102 are joined together with the metal regions 1108 used to isolate the P-channel transistors 1104A-D for receiving a ground or lowest potential voltage at node 1114 for the purposes of providing optimum radiation hardening. The metal scheme shown in FIG. 11 can be expanded to an entire integrated circuit device for the purpose of virtually eliminating all possible paths of radiation-induced inter-device and intra-device leakage currents between and within transistors, whether formed in a well, or directly in the epitaxial layer or substrate.

Although illustrative embodiments of the present invention, and various modifications thereof, have been described in detail herein with reference to the accompanying drawings, it is to be understood that the invention is not limited to these embodiments and the described modifications, and that various changes and further modifications may be effected therein by one skilled in the art without departing from the scope or spirit of the invention, which is defined in the claims, below.

What is claimed is:

1. A radiation-hardened transistor, comprising:
   an active region surrounded by a first oxide layer;
   a gate crossing the active region, defining first and second source/drain regions;
   a second oxide layer covering the active region and the gate; and
   a single metal region directly disposed on a top surface of the second oxide layer overlapping the boundary of the active region and completely surrounding each of the ends of the gate that extends beyond the border of the active region,
   such that negative charge buildup is suppressed during exposure to ionizing radiation.

2. The radiation-hardened device of claim 1, wherein the transistor comprises an N-channel transistor.

3. The radiation-hardened device of claim 1, wherein the metal region is coupled to ground.

4. The radiation-hardened device of claim 1, wherein the gate comprises a polysilicon or metal gate.

5. A radiation-hardened transistor, comprising:
   an active region surrounded by a first oxide layer;
   a gate crossing the active region, defining first and second source/drain regions;
   a second oxide layer covering the active region and the gate; and
   a single metal region directly disposed on a top surface of the second oxide layer overlapping the boundary of the active region, completely surrounding a first end of the gate extending beyond the border of the active region, and completely covering a second end of the gate extending beyond the border of the active region,
   such that negative charge buildup is suppressed during exposure to ionizing radiation.

6. The radiation-hardened device of claim 5, wherein the transistor comprises an N-channel transistor.

7. The radiation-hardened device of claim 5, wherein the metal region is coupled to ground.

8. The radiation-hardened device of claim 5, wherein the gate comprises a polysilicon or metal gate.

* * * * *